(12) United States Patent
Imamura

(10) Patent No.: US 7,902,076 B2
(45) Date of Patent: Mar. 8, 2011

(54) METHOD OF FABRICATING SEMICONDUCTOR DEVICE

(75) Inventor: Tsubasa Imamura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 12/477,688

(22) Filed: Jun. 3, 2009

(65) Prior Publication Data
US 2010/0003818 A1   Jan. 7, 2010

(30) Foreign Application Priority Data
Jul. 4, 2008   (JP) .................... 2008-175743

(51) Int. Cl.
*H01L 21/302* (2006.01)
*H01L 21/461* (2006.01)
(52) U.S. Cl. .......... 438/705; 438/640; 216/76; 216/62; 216/55; 257/E21.238; 257/E21.249; 257/E21.579
(58) Field of Classification Search .......... 438/705, 438/739, 640; 216/76, 55, 62; 257/E21.238, 257/E21.249, E21.579, E21.577
See application file for complete search history.

(56) References Cited

U.S. PATENT DOCUMENTS

| | | | | |
|---|---|---|---|---|
| 6,171,951 B1 * | 1/2001 | Lee et al. | ...... | 438/640 |
| 6,335,261 B1 * | 1/2002 | Natzle et al. | ...... | 438/435 |
| 6,372,660 B1 * | 4/2002 | Jeng | ...... | 438/766 |
| 6,706,611 B2 * | 3/2004 | Jeng | ...... | 438/407 |
| 6,926,843 B2 * | 8/2005 | Cantell et al. | ...... | 216/51 |
| 7,786,016 B2 * | 8/2010 | Sinha et al. | ...... | 438/705 |
| 2004/0021224 A1 | 2/2004 | Fukuyama et al. | | |
| 2005/0017364 A1 | 1/2005 | Iba | | |
| 2005/0250309 A1 | 11/2005 | Fukuyama et al. | | |
| 2008/0171438 A1 * | 7/2008 | Sinha et al. | ...... | 438/689 |

FOREIGN PATENT DOCUMENTS

| | | |
|---|---|---|
| JP | 2004-071705 | 3/2004 |
| JP | 2005-045176 | 2/2005 |
| JP | 2006-108336 | 4/2006 |

* cited by examiner

*Primary Examiner* — Caridad M Everhart
(74) *Attorney, Agent, or Firm* — Finnegan, Henderson, Farabow, Garrett & Dunner, L.L.P.

(57) ABSTRACT

A method of fabricating a semiconductor device according to one embodiment includes: forming a porous film above a semiconductor substrate; forming an altered layer by applying alteration treatment to a first pattern region of the porous film up to a predetermined depth; forming a first concave portion by etching a second pattern region to a depth deeper than the predetermined depth, the second pattern region at least partially overlapping the first pattern region of the porous film having the altered layer formed therein; and forming a second concave portion by selectively removing the altered layer from the porous film after forming the first concave portion.

20 Claims, 7 Drawing Sheets

14   14 ALTERED LAYER

5 RESIST FILM

METHOD OF FABRICATING SEMICONDUCTOR DEVICE

CROSS-REFERENCE TO RELATED APPLICATIONS

This application is based upon and claims the benefit of priority from prior Japanese Patent Application No. 2008-175743, filed on Jul. 4, 2008, the entire contents of which are incorporated herein by reference.

BACKGROUND

As a conventional wiring forming technique using a dual damascene method, a technique to form an altered layer by applying surface treatment to a region that becomes a wiring trench pattern of a hard mask formed on an interlayer insulating film on a semiconductor substrate and to subsequently form a via hole in the interlayer insulating film by etching the altered layer in the hard mask and the interlayer insulating film using a resist pattern formed on the hard mask as a mask, has been proposed. In this technique, a wiring trench communicated with the via hole is formed in the interlayer insulating film by etching the interlayer insulating film using, as a mask, a hard mask in which the wiring trench pattern is formed by further selectively removing the altered layer. This technique, for example, is disclosed in JP-A-2006-108336.

Here, according to the method described in JP-A-2006-108336, since a resist pattern for forming a via hole is formed on a flat hard mask having an altered layer before the wiring trench pattern is formed, it is possible to accurately form a resist pattern for forming a via hole.

However, according to the method described in JP-A-2006-108336, since a rim of an opening of the via hole in the interlayer insulating film is likely to be removed by etching when forming a wiring trench in the interlayer insulating film, a diameter of the opening of the via hole is expanded (a slope descending toward the via hole is formed on a bottom of the wiring trench). Therefore, the via and the wiring are deformed and a possibility to cause deterioration of electric characteristics arises.

BRIEF SUMMARY

A method of fabricating a semiconductor device according to one embodiment includes: forming a porous film above a semiconductor substrate; forming an altered layer by applying alteration treatment to a first pattern region of the porous film up to a predetermined depth; forming a first concave portion by etching a second pattern region to a depth deeper than the predetermined depth, the second pattern region at least partially overlapping the first pattern region of the porous film having the altered layer formed therein; and forming a second concave portion by selectively removing the altered layer from the porous film after forming the first concave portion.

A method of fabricating a semiconductor device according to another embodiment includes: forming a porous film above a semiconductor substrate; forming a first altered layer by applying alteration treatment to a first pattern region of the porous film up to a predetermined depth; forming a second altered layer by applying alteration treatment to a second pattern region up to a depth deeper than the predetermined depth before or after forming the first altered layer, the second pattern region at least partially overlapping the first pattern region of the porous film; and forming a concave portion by selectively removing the first and second altered layers from the porous film.

DETAILED DESCRIPTION

Embodiment

FIGS. 1A to 1J are cross sectional views showing processes for fabricating a semiconductor device according to an embodiment.

Figure 1A:
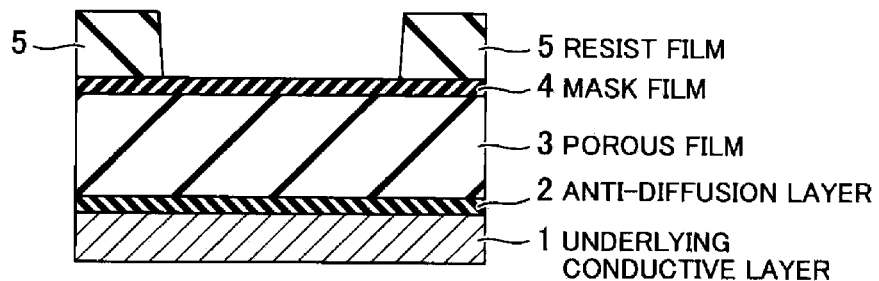
FIGS. 1A to 1J are cross sectional views showing processes for fabricating a semiconductor device according to an embodiment.

Firstly, as shown in FIG. 1A, an anti-diffusion layer 2, a porous film 3 and a mask film 4 are laminated on an underlying conductive layer 1 which is, e.g., a wiring, etc., provided on a semiconductor substrate (not shown) having a semiconductor element, etc., formed thereon, and then, a resist film 5 having a wiring pattern is formed on the mask film 4.

Here, the anti-diffusion layer 2 is made of, e.g., SiCN, SiC or SiN, etc., and is formed by a CVD (Chemical Vapor Deposition) method, etc. The anti-diffusion layer 2 has a function of suppressing diffusion of a metal in the underlying conductive layer 1 into the porous film 3.

Meanwhile, the porous film 3 is made of an insulating material containing Si and C such as SiOC, etc., and is formed by a PECVD (Plasma Enhanced CVD) method or a coating method, etc. A material of the porous film 3 is preferably a low-k material.

The mask film 4 is made of, e.g., $SiO_2$, etc., made from TEOS (Tetraethoxysilane), and is formed by the CVD method, etc. In addition, after forming a resist film 5 by the coating method, etc., a wiring pattern is formed thereto by a photolithography method.

Figure 1B:
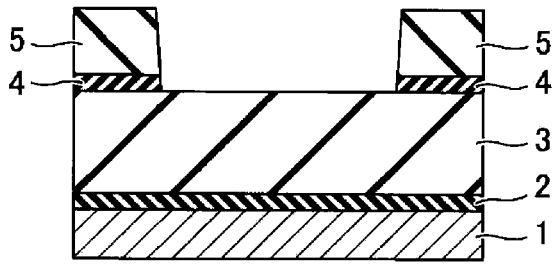

Next, as shown in FIG. 1B, the mask film 4 is etched by a dry etching method, etc., using the resist film 5 as a mask, thereby transferring the wiring pattern to the mask film 4.

Figure 1C:
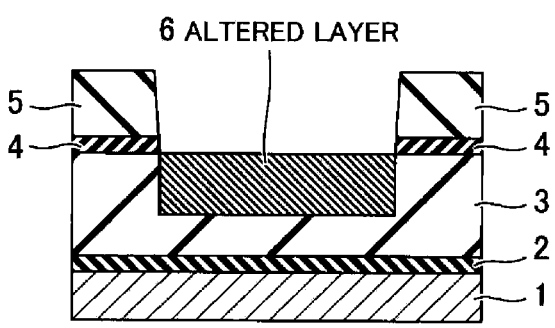

Next, as shown in FIG. 1C, alteration treatment such as anisotropic plasma treatment, etc., is performed using the resist film 5 as a mask, thereby forming an altered layer 6 having the wiring pattern in the porous film 3.

When plasma treatment is performed as the alteration treatment, the plasma treatment is performed, e.g., in an atmosphere of $O_2$, $N_2/H_2$, $H_2$, $CO/O_2$, $NH_3$, $Ar/O_2$ or $CO_2$, etc. At this time, since plasma easily affects the porous film 3 in a depth direction thereof, it is possible to accurately form the altered layer 6 having a predetermined depth while suppressing a dimension conversion difference by controlling treatment conditions. For example, when the porous film 3 is made of an insulating material containing Si and C such as SiOC, etc., a region to which the plasma treatment is performed loses carbon component and becomes the altered layer 6 containing mainly Si and O, which is a composition close to SiO$_2$. In these cases, only the altered layer 6 can be selectively removed from the porous film 3 by using, e.g., a dilute HF solution as an etchant.

Figure 1D:
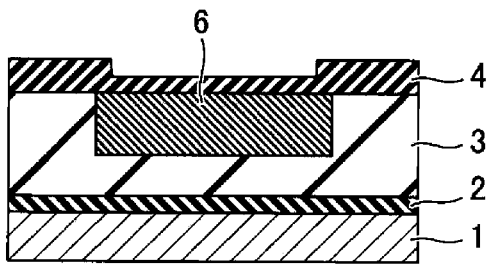

Next, as shown in FIG. 1D, after removing the resist film 5 by the dry etching method, etc., a material of the mask film 4 is deposited by the PECVD method, etc., so as to cover the altered layer 6, and thereby becomes a portion of the mask film 4. Note that, at this time, a material which is different from the material of the mask film 4 may be deposited and becomes the portion of the mask film 4.

Figure 1E:
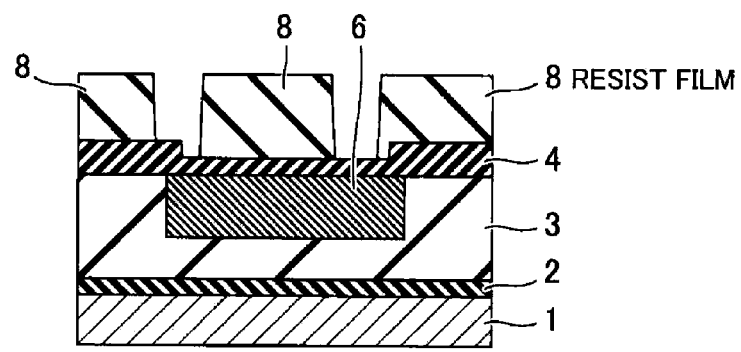

Next, as shown in FIG. 1E, a resist film 8 having a via-pattern at least partially overlapping the wiring pattern is formed on the mask film 4. At this time, since a via-pattern is formed to the resist film 8 by the photolithography method after forming the resist film 8 on the flat porous film 3 not having a wiring trench formed therein by the coating method, etc., it is possible to form an accurate pattern. In addition, the resist film 8 can be made of the same material as the resist film 5.

Figure 1F:
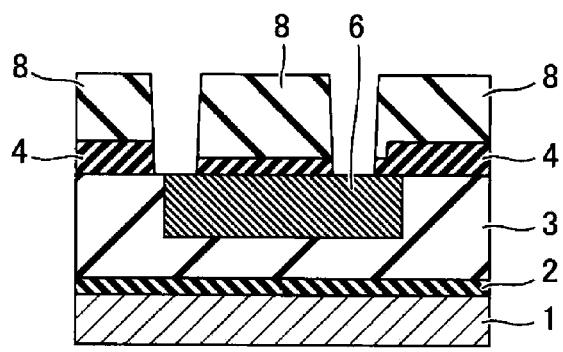

Next, as shown in FIG. 1F, the mask film 4 is etched by the dry etching method, etc., using the resist film 8 as a mask, thereby transferring the via-pattern to the mask film 4.

Figure 1G:
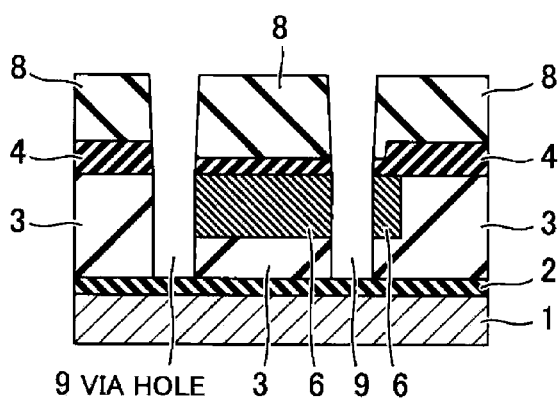

Next, as shown in FIG. 1G, the porous film 3 including the altered layer 6 is etched by the dry etching method, etc., using the resist film 8 and the mask film 4 as a mask, thereby transferring the via-pattern to the porous film 3. As a result, via holes 9 are formed in the porous film 3. At this time, the altered layer 6 is exposed on a portion of an inner side face of the via hole 9.

Figure 1H:
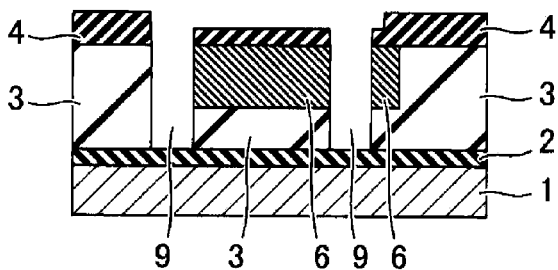

Next, as shown in FIG. 1H, the resist film 8 is removed by the dry etching method, etc.

Figure 1I:
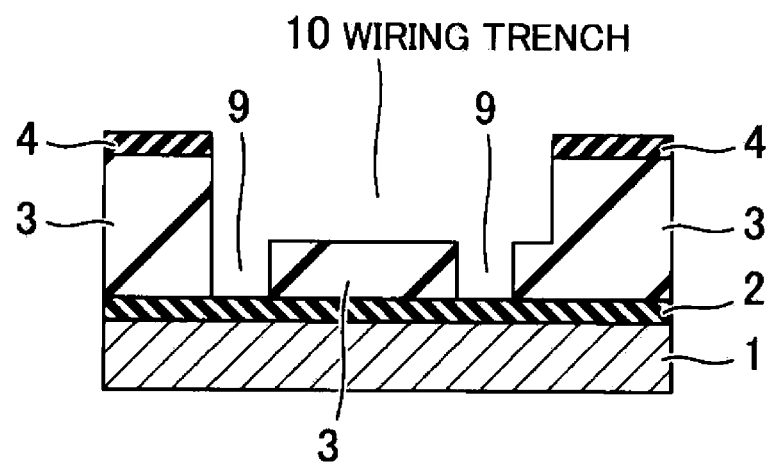

Next, as shown in FIG. 1I, the altered layer 6 in the porous film 3 is selectively removed by wet etching, etc., using a dilute HF solution as an etchant. As a result, a wiring trench 10 is formed in the porous film 3. At this time, the etchant reaches the altered layer 6 through the via holes 9 and removes the altered layer 6. Note that, the mask film 4 may be partially removed by the etching carried out for removing the altered layer 6 as shown in FIG. 1I, or alternatively, the film 4 may be completely removed.

Figure 1J:
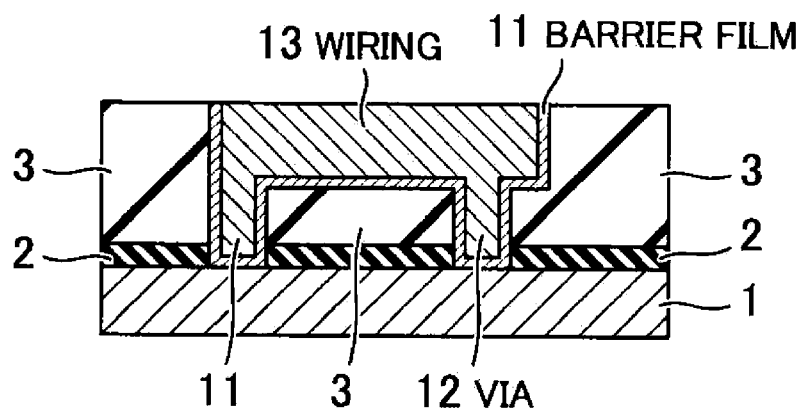

Next, as shown in FIG. 1J, after removing the anti-diffusion layer 2 immediately beneath the via holes 9 by a RIE (Reactive Ion Etching) method, etc., vias 12 and a wiring 13 which are covered by a barrier film 11 are formed in the via holes 9 and the wiring trench 10, respectively, by a dual damascene method, etc.

Here, the barrier film 11 is made of Ta, TaN, Ti or TiN, or a combination thereof, etc., and is formed on inner surfaces of the via holes 9 and the wiring trench 10 by a sputtering method, etc. Meanwhile, the vias 12 and the wiring 13 are integrally formed in the same process by, e.g., forming a seed film made of Cu on the inner surface of the barrier film 11 by the sputtering method, etc., and depositing Cu on the seed film by an electroplating method, etc. A material film of the barrier film 11 and that of the via 12 and the wiring 13 which are formed outside of the via holes 9 and the wiring trench 10 are removed by planarizing treatment such as a CMP (Chemical Mechanical Polishing) method, etc., and at this time, the mask film 4 on the porous film 3 is also removed together therewith.

Note that, similarly to the wiring trench 10, the via holes 9 can be formed by forming and removing an altered layer. A specific example will be described below.

Figure 2A:
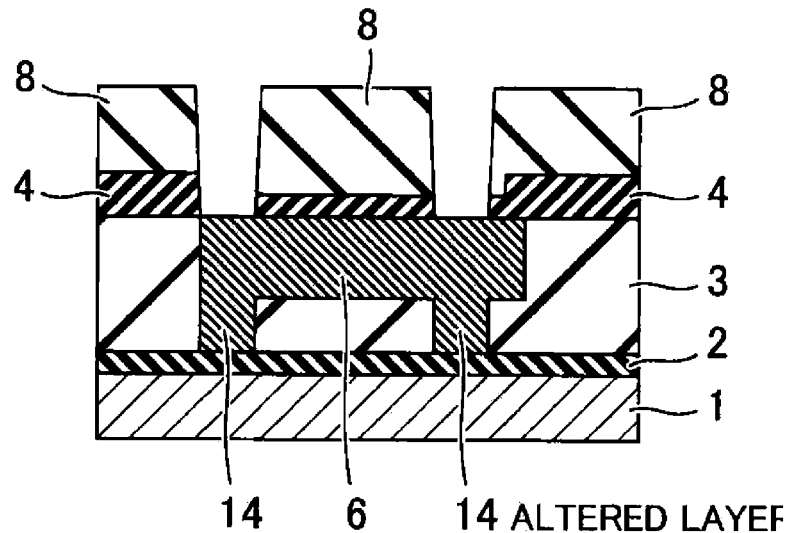
FIGS. 2A to 2C are cross sectional views showing processes for fabricating a semiconductor device according to the embodiment.

Firstly, after the process shown in FIG. 1F for transferring the via-pattern to the mask film 4, alteration treatment such as anisotropic plasma treatment, etc., is performed up to the bottom of the porous film 3 using the resist film 8 as a mask, thereby forming an altered layer 14 having a via-pattern in the porous film 3, as shown in FIG. 2A.

Figure 2B:
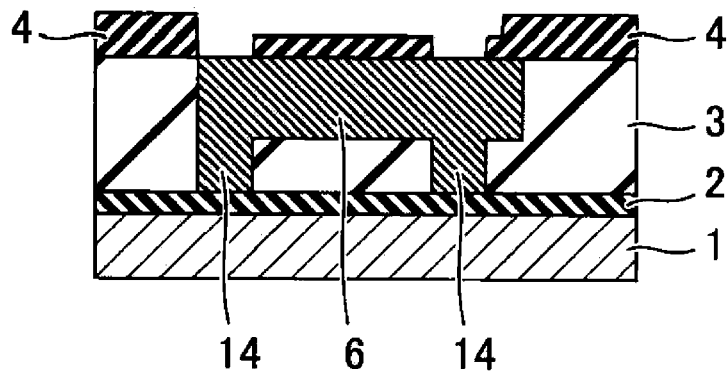

Next, as shown in FIG. 2B, the resist film 8 is removed.

Figure 2C:
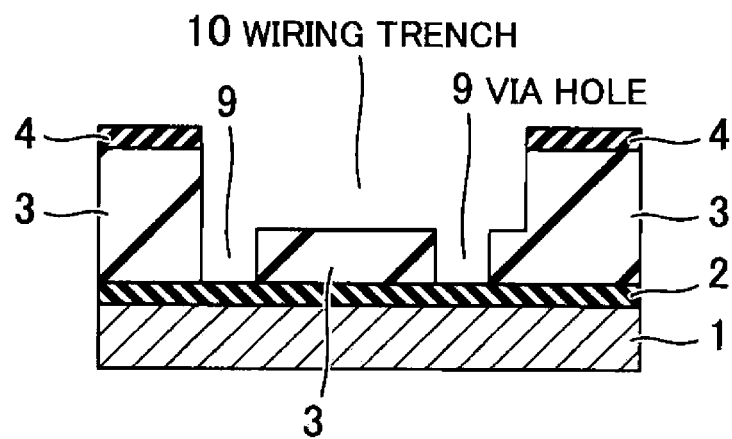

After that, as shown in FIG. 2C, the altered layer 14 having the via-pattern is removed together with the altered layer 6 having the wiring pattern, thereby forming the via holes 9 and the wiring trench 10.

Alternatively, in this case, the sequence of forming the altered layer 14 having the via-pattern and forming the altered layer 6 having the wiring pattern may be reversed. A specific example will be described below.

Figure 3A:
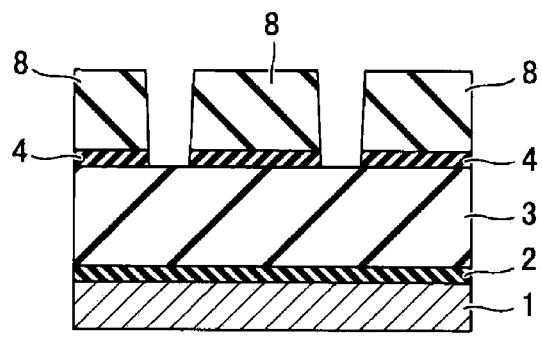
FIGS. 3A to 3G are cross sectional views showing processes for fabricating a semiconductor device according to the embodiment.

Firstly, as shown in FIG. 3A, a via-pattern is formed on the resist film 8 and the mask film 4 without carrying out the processes for forming the altered layer 6 shown in FIGS. 1A to 1C.

Figure 3B:
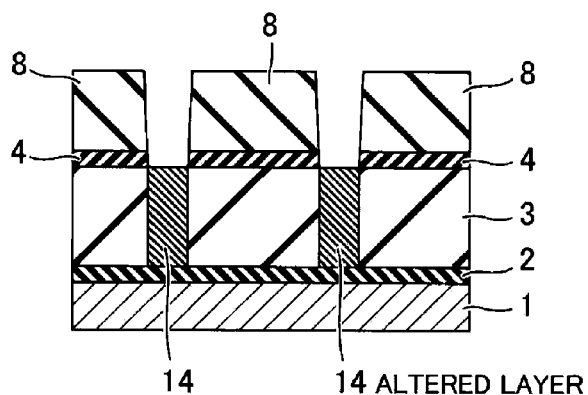

Next, as shown in FIG. 3B, anisotropic alteration treatment is performed up to the bottom of the porous film 3 using the resist film 8 as a mask, thereby forming the altered layer 14 in the porous film 3.

Figure 3C:
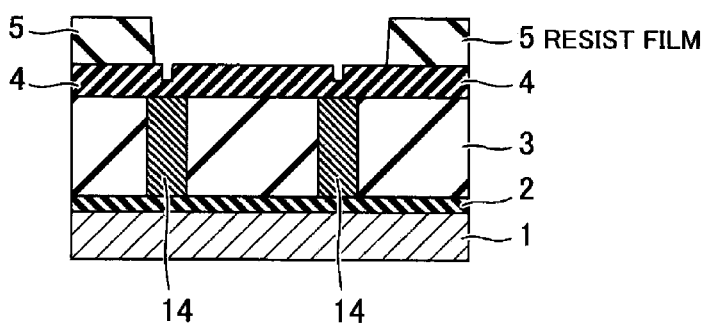

Next, as shown in FIG. 3C, after removing the resist film 8, a material of the mask film 4 is deposited so as to cover the altered layer 14, and thereby becomes a portion of the mask film 4. Furthermore, the resist film 5 having the wiring pattern is formed on the mask film 4.

Figure 3D:
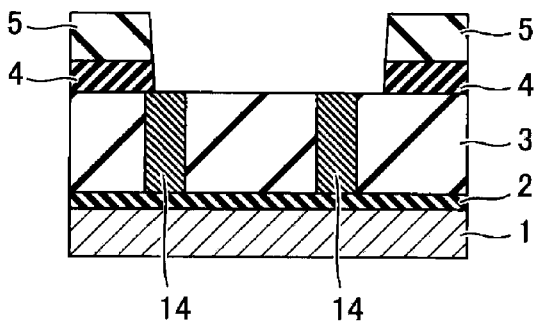

Next, as shown in FIG. 3D, the mask film 4 is etched by the dry etching method, etc., using the resist film 5 as a mask, thereby transferring the wiring pattern to the mask film 4.

Figure 3E:
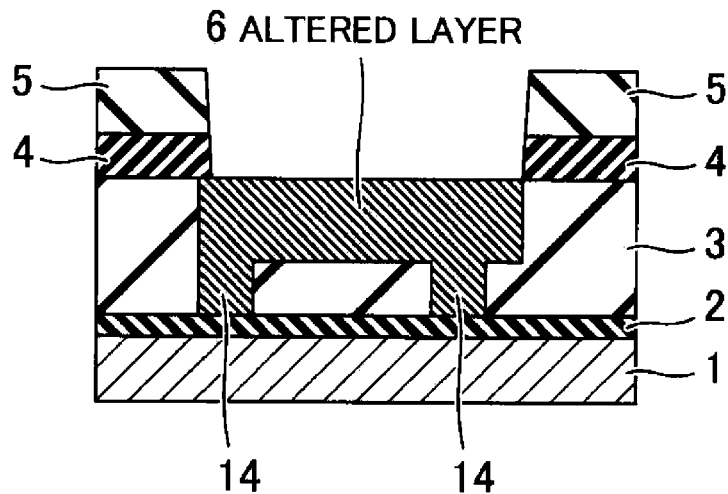

Next, as shown in FIG. 3E, alteration treatment is performed on the porous film 3 using the resist film 5 as a mask, thereby forming the altered layer 6 having the wiring pattern in the porous film 3.

Figure 3F:
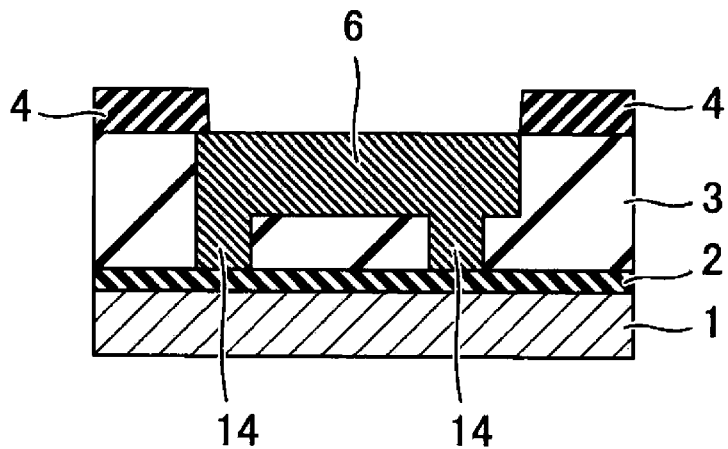

Next, as shown in FIG. 3F, the resist film 5 is removed.

Figure 3G:
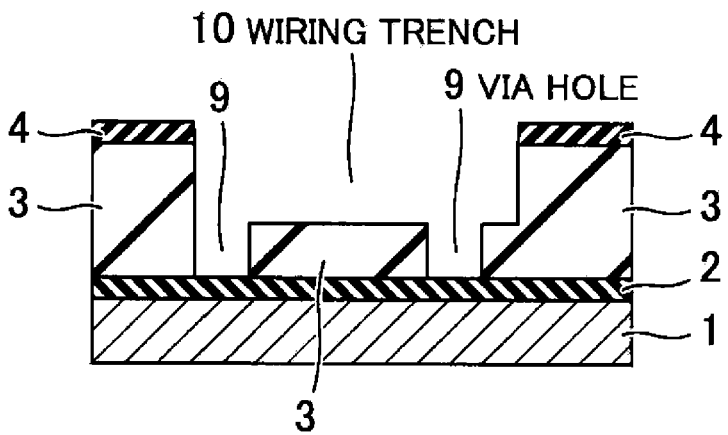

After that, as shown in FIG. 3G, the altered layer 14 is removed together with the altered layer 6, thereby forming the via holes 9 and the wiring trench 10.

Figure 4:
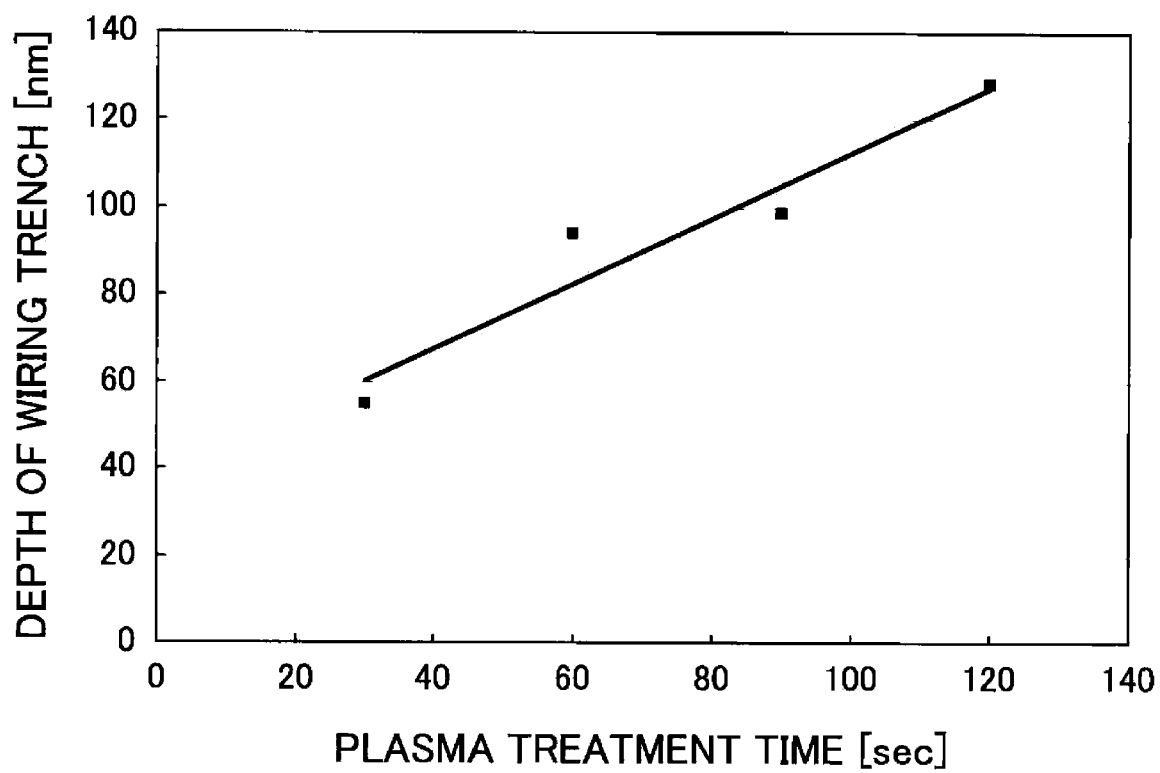
FIG. 4 is a graph showing a relation between a treating time of plasma treatment applied to a porous film 3 for forming an altered layer 6 and a depth of a wiring trench 10 formed in the porous film 3 from an upper surface of the porous film 3.

FIG. 4 is a graph showing a relation between a treating time of plasma treatment applied to a porous film 3 for forming an altered layer 6 in the process shown in FIG. 1C and a depth of a wiring trench 10 formed in the porous film 3 from an upper surface of the porous film 3 in the process shown in FIG. 1I.

FIG. 4 shows that the depth of the wiring trench 10 increases in substantially proportion to the increase of the treating time of the plasma treatment. As a result, it is understood that the depth of the altered layer 6 and thus a depth of the wiring 13 can be controlled relatively easily by the plasma treatment time.

What leads to this result is the fact that the depth of the altered layer 6 from the surface increases in substantially proportion to the increase of the treating time of the plasma treatment in the process shown in FIG. 1C and that, if an appropriate etchant is used, the wiring trench 10 can be formed by selectively removing only the altered layer 6 from the porous film 3 in the process shown in FIG. 1I.

Effect of the Embodiment

According to the present embodiment, since the wiring trench 10 is formed by forming the altered layer 6 in the porous film 3 and removing the altered layer 6 from the porous film 3, it is possible to form a via hole and a wiring trench with high shape accuracy compared with the case that the porous film is directly removed by etching, etc. As a result, it is possible to form the vias 12 and the wiring 13 with high shape accuracy in which deterioration of electric characteristics is suppressed.

In addition, it is possible to decrease inter-wiring capacity by using the porous film 3 which is a low-k material.

Other Embodiments

It should be noted that the present invention is not intended to be limited to the above-mentioned embodiment, and the various kinds of changes thereof can be implemented by those skilled in the art without departing from the gist of the invention. For example, the embodiment can be applied to a method for forming a concave portion composed of two trenches having widths and depths different from each other, such as a chip ring, etc., instead of forming the via holes 9 and the wiring trench 10. In this case, similarly to the relation between the depth of the via hole 9 and that of the wiring trench 10 in the present embodiment, a concave portion is formed so that a depth of a narrow trench corresponding to the via hole 9 is deeper than that of a wide trench corresponding to the wiring trench 10.

What is claimed is:

1. A method of fabricating a semiconductor device, comprising:
    forming a porous film above a semiconductor substrate;
    forming an altered layer by applying alteration treatment to a first pattern region of the porous film up to a predetermined depth;
    forming a first concave portion by etching a second pattern region to a depth deeper than the predetermined depth, the second pattern region at least partially overlapping the first pattern region of the porous film having the altered layer formed therein; and
    forming a second concave portion by selectively removing the altered layer from the porous film after forming the first concave portion.

2. The method of fabricating a semiconductor device according to claim 1, wherein the first and second pattern regions are a wiring pattern region and a via-pattern region, respectively; and
    the first and second concave portions are a via hole and a wiring trench, respectively.

3. The method of fabricating a semiconductor device according to claim 2, further comprising:
    forming a via and a wiring in the via hole and the wiring trench, respectively, by a dual damascene method.

4. The method of fabricating a semiconductor device according to claim 2, wherein the porous film comprises a low-k material.

5. The method of fabricating a semiconductor device according to claim 1, wherein the alteration treatment is plasma treatment.

6. The method of fabricating a semiconductor device according to claim 5, wherein the predetermined depth is controlled by a treating time of the plasma treatment.

7. The method of fabricating a semiconductor device according to claim 5, wherein the alteration treatment is anisotropic plasma treatment.

8. The method of fabricating a semiconductor device according to claim 5, wherein the plasma treatment is performed using any one of $O_2$, $N_2/H_2$, $H_2$, $CO/O_2$, $NH_3$, $Ar/O_2$ and $CO_2$.

9. The method of fabricating a semiconductor device according to claim 1, wherein the porous film comprises an insulating material containing Si and C; and
    the altered layer comprises a material containing mainly Si and O.

10. The method of fabricating a semiconductor device according to claim 9, wherein the altered layer is removed using a dilute HF solution.

11. A method of fabricating a semiconductor device, comprising:
    forming a porous film above a semiconductor substrate;
    forming a first altered layer by applying alteration treatment to a first pattern region of the porous film up to a predetermined depth;
    forming a second altered layer by applying alteration treatment to a second pattern region up to a depth deeper than the predetermined depth before or after forming the first altered layer, the second pattern region at least partially overlapping the first pattern region of the porous film; and
    forming a concave portion by selectively removing the first and second altered layers from the porous film.

12. The method of fabricating a semiconductor device according to claim 11, wherein the first and second pattern regions are a wiring pattern region and a via-pattern region, respectively; and
    the concave portion comprises a via hole and a wiring trench.

13. The method of fabricating a semiconductor device according to claim 12, further comprising:
    forming a via and a wiring in the via hole and the wiring trench, respectively, by a dual damascene method.

14. The method of fabricating a semiconductor device according to claim 12, wherein the porous film comprises a low-k material.

15. The method of fabricating a semiconductor device according to claim 11, wherein the alteration treatment is plasma treatment.

16. The method of fabricating a semiconductor device according to claim 15, wherein the predetermined depth is controlled by a treating time of the plasma treatment.

17. The method of fabricating a semiconductor device according to claim 15, wherein the alteration treatment is anisotropic plasma treatment.

18. The method of fabricating a semiconductor device according to claim 15, wherein the plasma treatment is performed using any one of $O_2$, $N_2/H_2$, $H_2$, $CO/O_2$, $NH_3$, $Ar/O_2$ and $CO_2$.

19. The method of fabricating a semiconductor device according to claim 11, wherein the porous film comprises an insulating material containing Si and C; and
    the first and second altered layers comprise a material containing mainly Si and O.

20. The method of fabricating a semiconductor device according to claim 19, wherein the first and second altered layers are removed using a dilute HF solution.

* * * * *